United States Patent [19]

Kahn

[11] 4,176,319
[45] Nov. 27, 1979

[54] DOUBLE SIDEBAND TRANSMISSION SYSTEM

[76] Inventor: Leonard R. Kahn, 137 E. 36th St., New York, N.Y. 10016

[21] Appl. No.: 637,660

[22] Filed: Dec. 4, 1975

[51] Int. Cl.$^2$ ............................................. H04B 1/68
[52] U.S. Cl. ..................................... 325/138; 332/44; 325/153
[58] Field of Search ................... 325/49, 50, 136, 137, 325/138, 139, 156, 153, 182; 332/37 D, 37 R, 44, 45, 46

[56] References Cited

U.S. PATENT DOCUMENTS

| | | | |
|---|---|---|---|
| 2,784,311 | 3/1957 | Kahn | 332/44 X |
| 3,026,489 | 3/1962 | Gold | 325/138 X |

OTHER PUBLICATIONS

Electronics, Feb. 5, 1960, pp. 47–49, "New Suppressed-Carrier Technique: Dysinger et al."
Radio Amateur's Handbook, 1972, pp. 222–223.

Primary Examiner—Benedict V. Safourek

[57] ABSTRACT

An improved system and method for processing and amplifying double-sideband suppressed or reduced carrier waves using high efficiency amplifiers and not requiring frequency dividers. Typical practice of the invention involves generating a double-sideband suppressed carrier wave in a balanced modulator; for example, at a sub-harmonic carrier frequency and multiplying the frequency of the output of the balanced modulator by an odd multiplication factor greater than one in the modulated amplifier.

The required envelope modulation (amplitude modulation) component is derived from the original balanced modulator output by use of an envelope demodulator and the component is used to modulate the modulated stage so as to reproduce the double-sideband suppressed carrier wave at a high power level.

This invention may also be used in reduced carrier double-sideband transmitters; i.e., where the carrier is not fully suppressed but where the carrier is smaller in amplitude than the peak amplitude of the combined upper and lower sideband waves.

18 Claims, 6 Drawing Figures

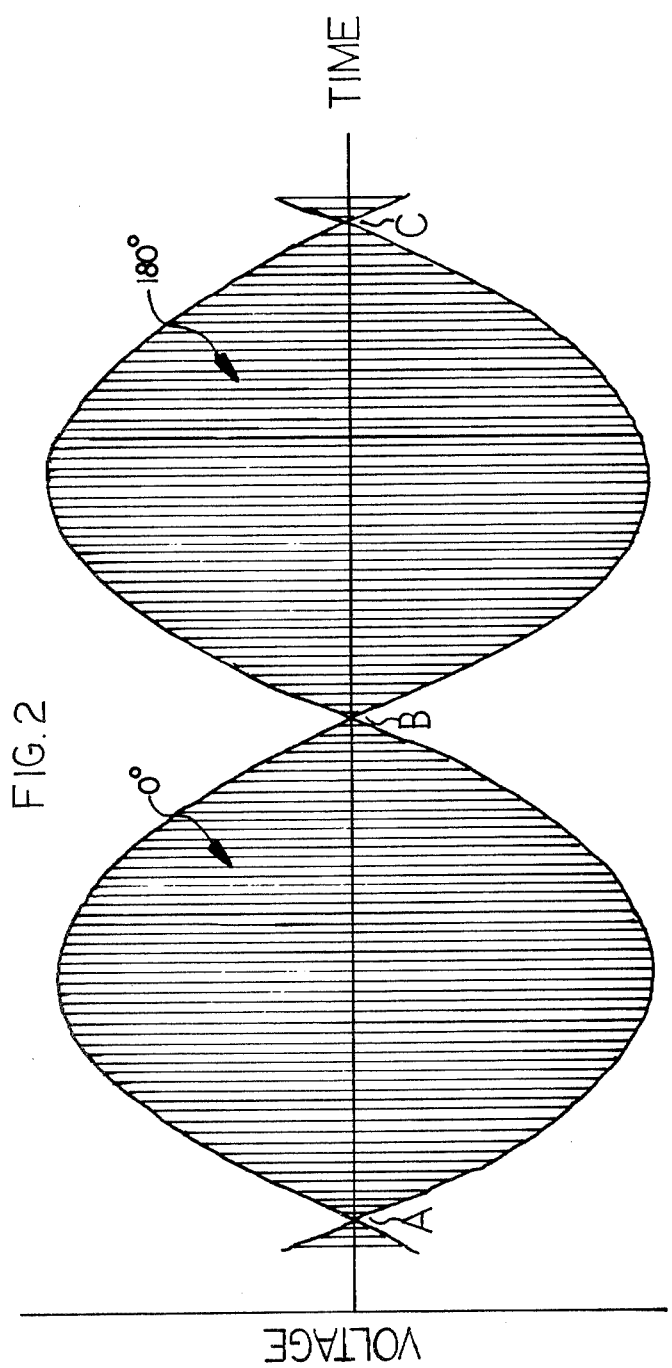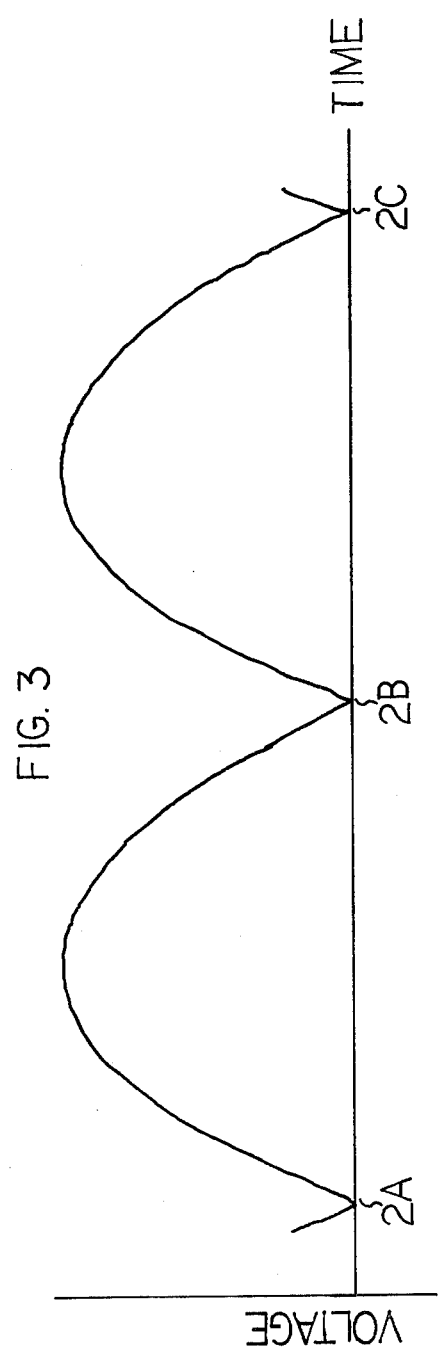

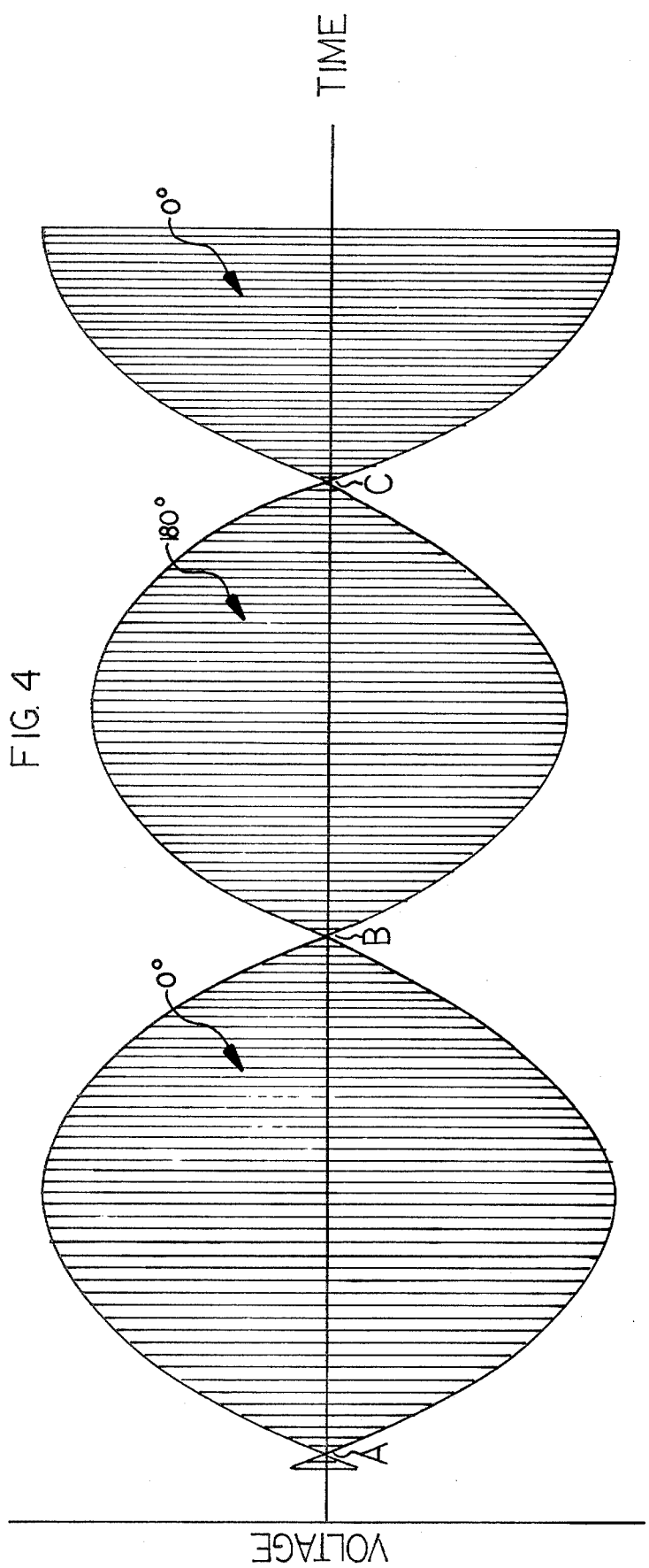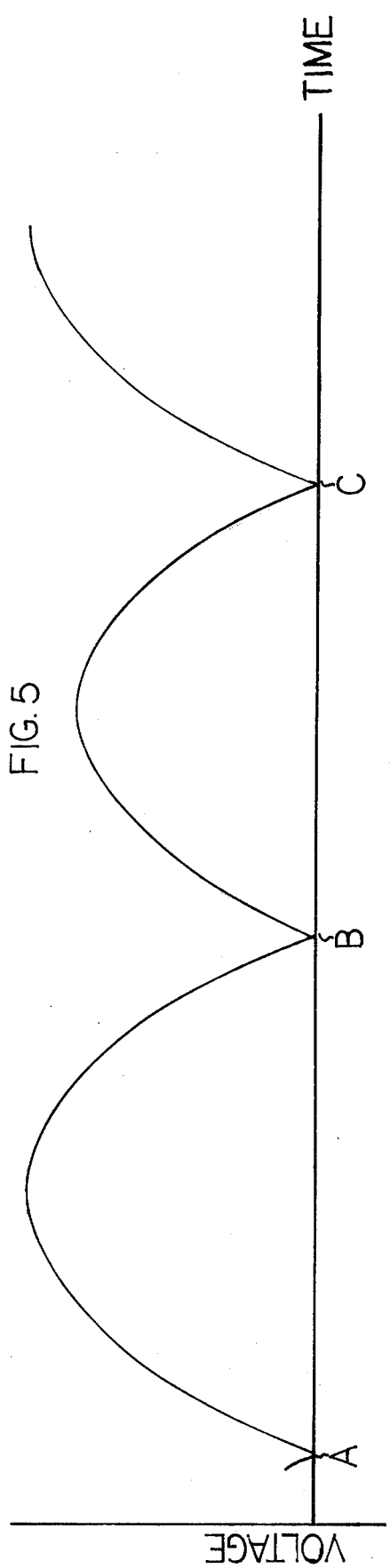
FIG. 4
FIG. 5

DOUBLE SIDEBAND TRANSMISSION SYSTEM

BACKGROUND OF THE INVENTION

1. Field of the Invention

This invention relates to a double-sideband reduced (diminished) or suppressed carrier transmitters, incorporating the basic procedure of providing a separate nonlinear amplification means for the phase modulation component of a double-sideband reduced or suppressed carrier wave and a second path for the envelope modulation component to provide a high efficiency transmitter for said double-sideband waves.

2. Description of the Prior Art

Double-sideband waves are modulated waves having symmetrical upper and lower sidebands and may be generated in balanced modulators either operating at the final frequencies or at an intermediate frequency which is converted to a final frequency. The signal is generally amplified to a suitable power level in a conventional linear amplifier. Another method which may be used has been disclosed in prior U.S. Pat. Nos. 2,666,133 issued Jan. 12, 1954, 2,774,041 issued Dec. 11, 1956, 2,784,311 issued Mar. 5, 1957, 2,992,326 issued July 11, 1961, 3,012,209 issued Dec. 5, 1961, 3,120,642 issued Feb. 4, 1964 and 3,201,694 issued Aug. 17, 1965, and in the papers "Comparison of Linear Single-Sideband Transmitters with Envelope Elimination and Restoration Single-Sideband Transmitters" by L. R. Kahn, Proceedings of the I.R.E., Vol. 44, No. 12, December 1956 and "Single-Sideband Transmission by Envelope Elimination and Restoration" by L. R. Kahn, Proceedings of the I.R.E., Vol. 40, No. 7, July 1952. Additional information regarding the design of most of the circuit elements in this invention are provided in these patents and papers. The Envelope Elimination and Restoration (EER) method described in these patents and papers splits the SSB or double-sideband reduced or suppressed carrier wave into its two basic components, the envelope modulation component and the phase modulation component. The phase modulation component may be amplified in nonlinear high efficiency amplifiers and the envelope modulation component amplified in low frequency linear audio amplifiers. The envelope component is later reintroduced by use of an amplitude modulator. Recently, a system, similar to the envelope elimination and restoration system, has been used experimentally in transistorized equipment where linear amplification is inefficient and subject to substantial distortion. A paper describing this type of transistorized equipment is; "Design of a High-Efficiency V.H.F. Double-Sideband Diminished Carrier Transmitter Having Low Spurious Emission" by V. Petrovic and W. Gosling; Proc. IEE, (English) Vol. 121, No. 2, February 1974.

The fact that the phase modulation component in the EER system may be multiplied in frequency if the phase modulation is divided by the same factor of multiplication was disclosed in U.S. Pat. No. 2,666,133 issued Jan. 12, 1954. However, frequency division adds complexity and cost to the system and can introduce some distortion.

3. Summary of the Invention

The present invention substantially obviates one or more of the limitations and disadvantages of the described prior art arrangements.

This invention discloses means and methods for producing a double-sideband suppressed or reduced carrier signal having low spurious output and utilizing high efficiency circuits.

Another basic object, feature, and advantage of the invention, is that it allows the use of transistor amplifiers having substantial leakage between the input and output circuits of said amplifiers. The present invention allows the use of high efficiency nonlinear amplification and does not require the use of frequency division circuits and may be used at relatively high frequencies.

These, and other objects, features, characteristics, and advantages of the system and signal development techniques of the invention will be apparent from the following description of certain typical forms thereof, taken together, with the accompanying drawings.

BRIEF DESCRIPTION OF THE DRAWINGS

FIGS. 2 to 5 are representations of typical wave shapes illustrating the mode of operation of the invention.

FIG. 2 represents the waveshape of a double-sideband suppressed carrier wave modulated by a sine wave.

FIG. 3 represents the envelope waveshape of FIG. 2.

FIG. 4 represents the waveshape of a double-sideband reduced carrier wave modulated by a sine wave.

FIG. 5 represents the envelope waveshape of FIG. 4.

DESCRIPTION OF THE PREFERRED EMBODIMENT

Figure 1:
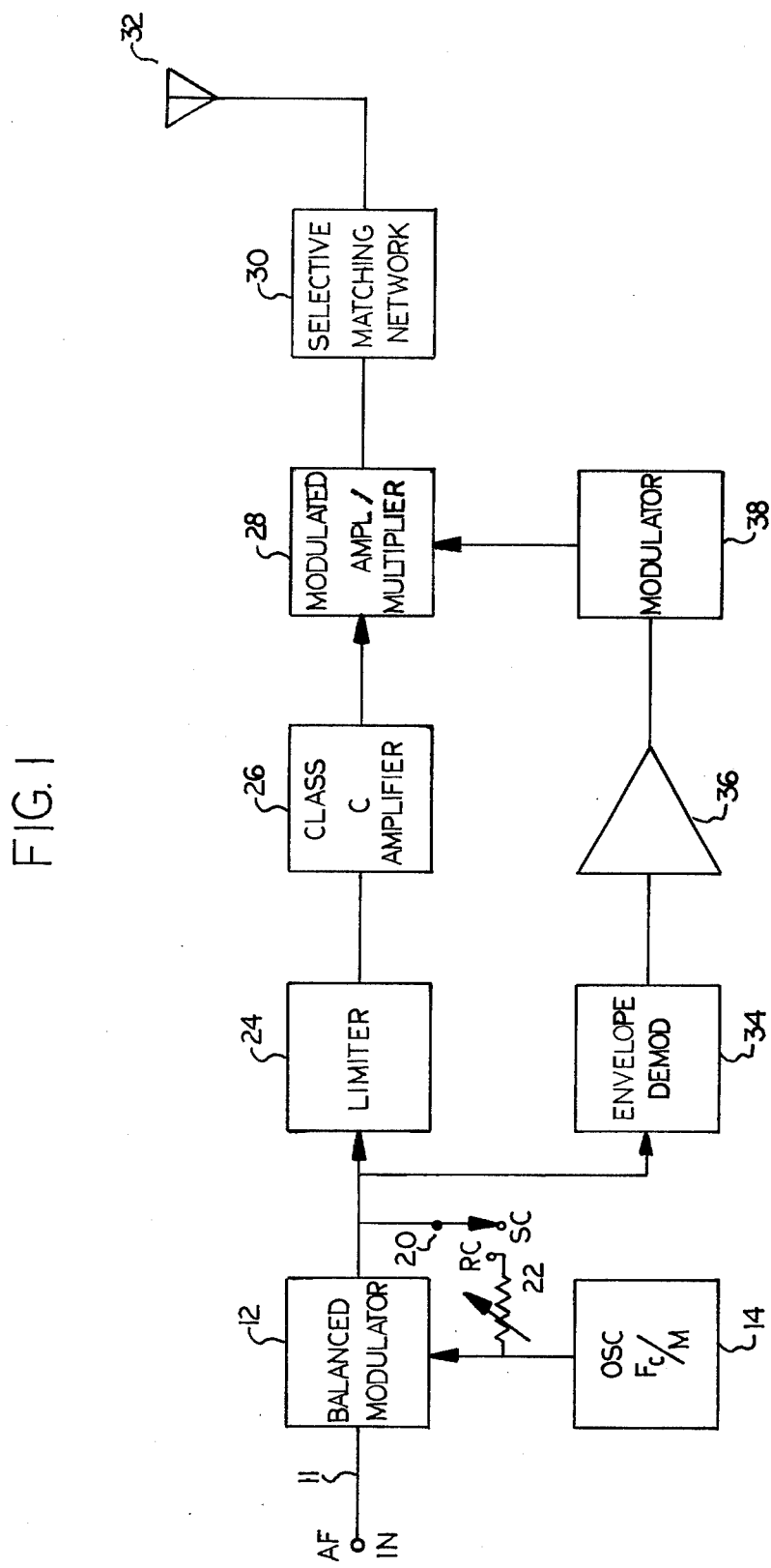
FIG. 1 is a Block Diagram showing a form of the invention for processing a modulating wave to produce a double-sideband suppressed carrier wave of proper frequency and power for transmission over radio paths.

FIG. 1 illustrates, in block diagram form, a typical transmitter embodying the present invention. The audio signal is fed through line 11 to a balanced modulator 12. The balanced modulator produces a double-sideband suppressed carrier signal. It is also fed by an oscillator from block 14 which sets the frequency of the suppressed carrier. The frequency of the suppressed carrier at this point is related to the output carrier frequency by a factor of 1/M. In other words, it operates at a sub-harmonic (i.e., exact integral submultiple of another frequency) of the radiated output carrier frequency. M is an odd integer greater than one in the present invention.

Switch 20 may be used to pass a part of the carrier wave to the output of the balanced modulator 12 if reduced carrier rather than suppressed carrier transmission is required. It is desirable to transmit a reduced carrier wave rather than a suppressed carrier wave in some situations so that the receiver may select and amplify the carrier to a proper level for demodulation. However, there are procedures, not requiring a carrier, for demodulation of double-sideband suppressed carrier signals. For example, U.S. Pat. No. 2,784,311 issued on Mar. 5, 1957, discloses one such method. The reduced carrier may also be used as the reference level for an automatic volume control (AVC) system.

Switch 20 is shown in the suppressed carrier position (SC). If it is thrown to the reduced carrier position (RC) variable resistor 22 may be used to adjust the amplitude of the reduced carrier. The output of the balanced modulator with suppressed or with reduced carrier is fed to limiter 24. Limiter 24 removes the amplitude modulation component providing a constant amplitude phase modulated wave for exciting Class C amplifier 26. It should be noted that the limiter is not a basic requirement to the system because the nonlinear amplifiers used in the PM component path may be biased so as to be relatively insensitive to the amplitude of the wave feeding them and accordingly eliminates the requirement for separate limiter circuits.

Amplifier 26 may be a linear or nonlinear amplifier; however, nonlinear classes of amplification are more efficient and would normally be used. Amplifier 26 may also be a frequency multiplier which reduces the feed-through and neutralization problems. If the stage operates as a frequency multiplier it should multiply by an odd integer. Even multiplication may not be used because the overall system must provide odd order multiplication. As is pointed out below, the phase deviation of the overall transmitter must be 180 degrees and any combination of frequency multiplication may be used as long as the correct phase deviation is achieved.

The output of Class C amplifier 26 feeds the modulated amplifier stage 28. The output of this stage may feed directly the antenna or a linear amplifier. It is highly desirable that modulated amplifier 28 operate as a frequency multiplier. By operating as a frequency multiplier the feed-thru of this circuit is, for practical purposes eliminated and the system is capable of complete modulation in the negative direction. If this amplifier operates as a straight thru amplifier, a leakage term will be passed greatly increasing the spurious output levels of this system. The paper, "Design of a High Efficiency V.H.F. Double-Sideband Diminished-Carrier Transmitter Having Low Spurious Emission" by V. Petrovic and W. Gosling analyzes the deleterious effects of this leakage. A frequency multiplier would greatly attenuate such leakage because the fundamental term fed to the input of the amplifier is substantially reduced by the selective matching network 30 used between the amplifier output circuit and the antenna. Such selectivity is provided for proper operation of the amplifier and also for impedance matching the antenna and modulated amplifier 28. Selective matching network 30 may be of conventional design but special care should be taken that there is good selectivity against the frequency fed to the input of modulated amplifier 28. Modulated amplifier 28 should follow normal design procedures for optimizing the efficiency of the amplifier frequency multiplier while operating as an efficient and low distortion amplitude modulated stage.

The envelope component of the double-sideband wave is derived from the output of the balanced modulator circuit 12 by use of an envelope demodulator 34. This circuit may use a conventional envelope demodulator using diodes or it may use a multiplication circuit multiplying the input of limiter 24 by the output of limiter 24. The output of envelope demodulator 34 is amplified in audio amplifier 36 which in turn feeds modulator 38. The modulator then is used to amplitude modulate modulated amplifier 28. As discussed in papers describing the envelope elimination restoration system it is important that the modulator have sufficient bandwidth to pass the harmonic terms in the envelope. It is also necessary, in order to maintain the proper average amplitude of the output wave, that the modulator system pass the average amplitude component. This can be done by using dc coupling in amplifier 36 and modulator 38 so as to pass the average amplitude as demodulated in envelope demodulator 34.

As disclosed in the prior art; for example, U.S. Pat. No. 2,666,133 issued on Jan. 12, 1954, it is necessary to equalize the time delay between the phase modulation path and the envelope modulation path. This may be done by adjusting the bandwidth of the two paths so that the time delay is equalized. Alternatively, as shown in U.S. Pat. No. 2,666,133, FIG. 5, and FIG. 7B a variable time delay network may be included in the path having the shorter time delay. For example, if the delay in the phase modulation path is less than that in the envelope modulation path the time delay network should be inserted in the phase modulation path.

The main reason for using frequency multiplication in the instant invention is to minimize the leakage term in the modulated stage. The leakage term is a pure phase modulated wave and does not include the envelope modulation component which is part of the desired double-sideband wave. Radiation of the pure phase modulation component term greatly increases interference to adjacent channels. This is especially serious when the transmitter is used for mobile communications system where the location of the transmitter is a variable and can be close to receivers tuned to an adjacent channel. (The design of frequency multipliers has been covered in many textbooks. Transistor frequency multipliers are described in some detail in the RCA Silicon Power Circuits manual, Technical Series SP50, published by Radio Corporation of America, Electronics Components and Devices, Harrison, N.J., pages 343 to 355.)

The multiplication factor of the modulated amplifier must be an odd integer if the deviation of the phase modulated wave fed to modulated amplifier is 180 degrees. The reason for this can be seen by considering FIG. 2. FIG. 2 shows the waveshape of a double-sideband suppressed carrier signal when modulated by a sine wave. The vertical coordinates of FIGS. 2 to 5 are voltage (amplitude) and the horizontal coordinates are time and the figures illustrate waveshapes for sinusoidal modulation. The envelope of this wave is shown in FIG. 3 and one skilled in the art will recognize this envelope waveshape to be a full wave rectified sine wave.

At the zero crossing points of the envelope, Points (A) and (B) of FIG. 2, the RF wave reverses phase by 180° (i.e., the phase deviation is 180 degrees). This phase reversal is basic to the double-sideband wave and must be present at the output of the transmitter if the wave is to have the proper double-sideband suppressed carrier characteristics. Even factor frequency multiplication of the full 180 degree deviation phase modulation component would radically change the characteristic of the wave by removing the phase modulation deviation. For example, if a 180° phase deviation wave was passed through a frequency doubler, the wave would jump between 0° and 360° instead of 0° and 180°. Since 360° and 0° are identical points if the phase plane, such multiplication would remove the phase modulation (PM) and produce a full carrier wave. However, in an odd multiplication factor; for example, three was used, the phase would jump between 0° and 540°. Since 540° is identical to 180° in the phase plane, the original phase modulation would not be distorted and the overall system would produce the desired double-sideband suppressed carrier wave.

Thus, the use of odd integer multiplication factors in the PM branch, once the PM component has a full 180° deviation, does not degrade the basic modulation characteristic of the double-sideband suppressed carrier wave. The present invention, in comparison with the prior art where frequency division and frequency multiplication having the same factors is used to maintain undistorted phase modulation, eliminates the use of frequency dividers. Furthermore, frequency dividers may introduce phase distortion and undesirable transient characteristics. Thus, the subject invention reduces distortion, cost and circuit complexity in comparison with the prior art.

FIG. 4 shows the waveshape of a reduced carrier double-sideband signal modulated by a sine wave. This type of wave would be generated if the switch 20 in FIG. 1 was thrown to the RC (reduced carrier) position.

FIG. 5 shows the envelope of the reduced carrier wave of FIG. 4. In this case, the envelope is not a full wave rectified sinewave as shown in FIG. 3 but shows a nonsymmetrical folded over portion of a sine wave. At Points (A), (B) and (C) of FIG. 4 there are phase reversals of 180°. For example, from Point (A) to (B) the RF phase is zero, from Point (B) to (C) the RF phase is 180° and from (C) to (D) the phase is restored to 0°. If an odd frequency multiplier is used in the PM branch where 180 degree deviation is present, the phase modulation of the double-sideband reduced carrier wave shown in FIG. 4 is not disturbed. This illustrates the fact that the invention functions properly for double-sideband suppressed or reduced carrier systems.

The Petrovic and Gosling paper described a double-sideband device employing means for generating the envelope modulation component and phase modulation component of a double-sideband wave directly from the audio signal. The rest of the signal processing follows the conventional EER system as shown in FIG. 1.

Figure 6:
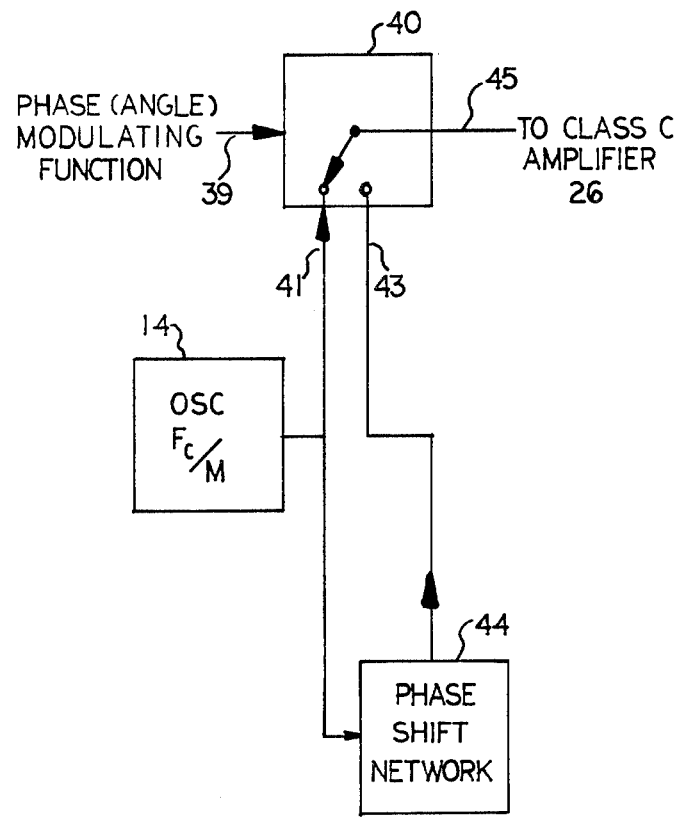
FIG. 6 is a block diagram of special circuitry required in one embodiment of the invention. The block diagram shows a means for producing a phase modulation component of a double-sideband wave having a phase deviation of less than 180 degrees.

Direct generation of the phase and envelope modulation components of a double-sideband wave is relatively easy to accomplish as may be used by examining FIGS. 2 to 5 and such methods are described in detail in the Petrovic and Gosling paper (see their FIG. 6 for details and their associate description.)

The Petrovic and Gosling paper disclosed the use of a balanced modulator driven by the audio angle (phase) modulating function generated in their FIG. 6. The use of a balanced modulator is desirable when the instant invention is used to generate a phase modulation component having a deviation of 180 degrees. The directly generated angle or phase modulation component can be used to feed limiter 24 or Class C amplifier 26 and the directly generated envelope modulation component may be used to feed audio amplifier 36 in FIG. 1.

This invention may also be used with both even and odd factor multiplication. But in this case the simple balanced modulator circuit cannot be used because a phase deviation which is a sub-multiple of 180 degrees is required. The simple balanced modulator would then be replaced by a single pole double-throw electronic switch where the arm switches between a first position connected to the subharmonic of the output frequency, or the IF in those systems using an IF, and a second position displaced in phase by 180° divided by the desired multiplication factor. For example, if a frequency doubler (multiplication factor equals 2) is to be used, a phase shifter displacing phase by 180°/2 or 90 degrees is required. Such switching and phase shifting circuits are well known to those skilled in the applicable art.

FIG. 6 shows the special circuitry required to use this invention with even as well as odd factor multiplication. This circuitry is used to provide a phase modulated wave having a phase deviation which is a submultiple of 180 degrees. The phase or angle modulating function is derived from the input audio signal as described in the Petrovic, Gosling paper and shown in their FIG. 6 as well as other sections in their paper. This modulating function is connected to line 39 and keys the electronic switch 40. The switch accordingly switches whenever the phase should be changed. The switch 40 is fed either a radio frequency or IF wave via line 41. FIG. 6 shows the radio frequency embodiment. Oscillator 14, which generates a radio frequency wave, feeds switch 40 and also feeds phase shift network 44. Network 44 produces the required submultiple of 180 degrees to insure 180 degrees deviation after the phase modulated wave passes through the associated frequency multiplier as shown in FIG. 1.

Once the components are generated, the processing of the instant invention may be used as shown in FIG. 1. The PM component of an odd subharmonic of the output frequency may either be fed to the input of Limiter 24 or Class C (or Class D) amplifier 26. Then envelope modulation component is fed to the input of amplifier 36.

It is often desirable to build equipment at a fixed frequency called an intermediate frequency (IF) and convert or translate the signal from the IF to a desired radio frequency. For example, signal generating equipment may operate at a 10.7 MHz IF and the IF signal translated to the desired output radio frequency or a subharmonic of it. When the EER embodiment of this invention is used with an IF circuit at least the Phase Modulation component of the double-sideband wave must be translated. Thus, the entire double-sideband wave may be translated or the double-sideband wave may be first passed through a limiter which would remove the envelope modulation and then the resulting phase modulated wave would be translated.

It should be noted that the following three main embodiments of the invention have been disclosed:

(1) The conventional Envelope Elimination and Restoration system (EER) for double-sideband transmission wherein a double-sideband wave is generated at a low power level and the envelope and phase modulation components are derived from the low power level wave in accordance with the prior art. The full deviation phase modulation is frequency multiplied by an odd integer so as to retain the required phase deviation.

(2) A modified EER system wherein the double-sideband phase and envelope modulation components are synthesized directly from the input signal as disclosed in the prior art. In this embodiment of the invention the full deviation phase modulation is generated and frequency multiplied by an odd integer is utilized to maintain the required phase deviation.

(3) A modified EER system wherein, as in the preceding embodiment, the phase and envelope modulation components are synthesized directly from the input signal as disclosed in the prior art. However, in this embodiment of the invention both odd and even integer multiplication factors may be used. The phase modulation deviation is adjusted for 180°/M where M is an integer greater than unity and subsequent frequency multiplication produces full 180° phase deviation.

From the foregoing, various modifications, rearrangements and adaptions of the double-sideband transmission techniques and components presented will occur to those skilled in the art to which the invention is addressed, within the scope of the following claims.

What is claimed is:

1. The method of producing a double-sideband wave at a desired frequency, comprising the following steps:
    (a) generating a double-sideband wave at an odd sub-harmonic frequency of the desired frequency,
    (b) demodulating the envelope modulation component of the double-sideband wave, and
    (c) amplitude modulating the phase modulation component of the double-sideband wave by the demodulated envelope component in an amplitude modulated stage operating as an odd factor frequency multiplier.

2. The method, according to claim 1, including the step of limiting the double-sideband wave generated in Step (a).

3. The method, according to claim 1, where the double-sideband wave is a suppressed carrier wave.

4. The method, according to claim 1, where the double-sideband wave is a reduced carrier wave.

5. The method, according to claim 1, including the step of frequency multiplying the phase modulation component of the double-sideband wave by an odd factor in a stage in addition to the amplitude modulated stage.

6. A double-sideband transmitter comprising:
    (a) a double-sideband generator operating at a subharmonic frequency of the output frequency of the transmitter,
    (b) means for demodulating the envelope of the double-sideband wave generated by said generator,
    (c) a modulated amplifier operating as an odd factor frequency multiplier, and
    (d) modulating means for amplitude modulating the modulated stage with the demodulated envelope component to produce a double-sideband wave at the desired output frequency.

7. The double-sideband transmitter, according to claim 6, wherein the double-sideband generator produces a double-sideband suppressed carrier wave.

8. The double-sideband transmitter, according to claim 6, wherein the double-sideband generator produces a double-sideband reduced carrier wave.

9. The double-sideband transmitter, according to claim 6, including means for frequency multiplying the phase modulation component in odd factor frequency multiplier stage in the phase modulation component path in addition to the amplitude modulated stage.

10. The double-sideband transmitter, according to claim 6, wherein limiting means are provided for isolating the phase modulation component of the double-sideband wave generated in said double-sideband generator.

11. The method of producing a double-sideband wave at a desired frequency comprising the following steps:
    (a) generating a double-sideband wave at an intermediate frequency,
    (b) demodulating the envelope modulation component of the double-sideband wave,
    (c) translating the frequency of at least the phase modulating component of the intermediate frequency double-sideband wave to a frequency equal to an odd subharmonic of the desired frequency, and
    (d) amplitude modulating the frequency translated phase modulation component of the double-sideband wave by the demodulated envelope component in an amplitude modulated stage operating as an odd factor frequency multiplier.

12. The method according to claim 11, including the step of frequency multiplying the phase modulation component of the double-sideband wave by an odd factor in a stage in addition to the amplitude modulated stage.

13. The method, according to claim 11, including the step of limiting the double-sideband wave generated in Step (a).

14. The method, according to claim 11, where the double-sideband wave is a suppressed carrier wave.

15. The method, according to claim 11, where the double-sideband wave is a reduced carrier wave.

16. An envelope elimination and restoration double-sideband transmitter incorporating at least one stage in the phase modulation component path whose output frequency is an odd multiple of its input frequency and where the peak deviation of the phase modulation component at any point in the phase modulation component path is never less than 180 degrees.

17. The envelope elimination and restoration system, according to claim 16 wherein the double-sideband signal is a suppressed carrier signal.

18. The envelope elimination and restoration system, according to claim 16, wherein the double-sideband signal is a reduced carrier signal.

* * * * *